(12) United States Patent
Liu et al.

(10) Patent No.: US 8,278,152 B2
(45) Date of Patent: Oct. 2, 2012

(54) BONDING PROCESS FOR CMOS IMAGE SENSOR

(75) Inventors: Jen-Cheng Liu, Hsin-Chu (TW);
Dun-Nian Yaung, Taipei (TW);
Chen-Cheng Kuo, Chu-Pei (TW);
Chen-Shien Chen, Zhubei (TW);
Shou-Gwo Wuu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 9 days.

(21) Appl. No.: 12/626,296

(22) Filed: Nov. 25, 2009

(65) Prior Publication Data

US 2010/0090304 A1    Apr. 15, 2010

Related U.S. Application Data

(63) Continuation-in-part of application No. 12/206,349, filed on Sep. 8, 2008, now Pat. No. 7,633,165.

(51) Int. Cl.
*H01L 21/44* (2006.01)
(52) U.S. Cl. ........ 438/118; 438/106; 438/107; 438/109; 438/612; 438/614; 257/621; 257/678; 257/686; 257/698; 257/E21.597
(58) Field of Classification Search .................. None
See application file for complete search history.

(56) References Cited

U.S. PATENT DOCUMENTS

| | | |
|---|---|---|
| 5,391,917 A | 2/1995 | Gilmour et al. |
| 5,510,298 A | 4/1996 | Redwine |
| 5,767,001 A | 6/1998 | Bertagnolli et al. |
| 5,998,292 A | 12/1999 | Black et al. |
| 6,184,060 B1 | 2/2001 | Siniaguine |
| 6,322,903 B1 | 11/2001 | Siniaguine et al. |
| 6,448,168 B1 | 9/2002 | Rao et al. |
| 6,465,892 B1 | 10/2002 | Suga |
| 6,472,293 B1 | 10/2002 | Suga |
| 6,538,333 B2 | 3/2003 | Kong |
| 6,599,778 B2 | 7/2003 | Pogge et al. |
| 6,639,303 B2 | 10/2003 | Siniaguine et al. |
| 6,642,081 B1 * | 11/2003 | Patti .............................. 438/109 |
| 6,664,129 B2 | 12/2003 | Siniaguine et al. |
| 6,693,361 B1 | 2/2004 | Siniaguine et al. |
| 6,740,582 B2 | 5/2004 | Siniaguine |
| 6,800,930 B2 | 10/2004 | Jackson et al. |
| 6,841,883 B1 | 1/2005 | Farnworth et al. |
| 6,882,030 B2 | 4/2005 | Siniaguine |
| 6,924,551 B2 | 8/2005 | Rumer et al. |
| 6,962,867 B2 | 11/2005 | Jackson et al. |
| 6,962,872 B2 | 11/2005 | Chudzik et al. |

(Continued)

*Primary Examiner* — Kyoung Lee
(74) *Attorney, Agent, or Firm* — Haynes and Boone, LLP

(57) ABSTRACT

The present disclosure provides a method of making an integrated circuit (IC). The method includes forming an electric device on a front side of a substrate; forming a top metal pad on the front side of the substrate, the top metal pad being coupled to the electric device; forming a passivation layer on the front side of the substrate, the top metal pad being embedded in the passivation layer; forming an opening in the passivation layer, exposing the top metal pad; forming a deep trench in the substrate; filling a conductive material in the deep trench and the opening, resulting in a though-wafer via (TWV) feature in the deep trench and a pad-TWV feature in the opening, where the top metal pad being connected to the TWV feature through the pad-TWV feature; and applying a polishing process to remove excessive conductive material, forming a substantially planar surface.

19 Claims, 8 Drawing Sheets

U.S. PATENT DOCUMENTS

| | | |
|---|---|---|
| 7,030,481 B2 | 4/2006 | Chudzik et al. |
| 7,049,170 B2 | 5/2006 | Savastiouk et al. |
| 7,060,601 B2 | 6/2006 | Savastiouk et al. |
| 7,071,546 B2 | 7/2006 | Fey et al. |
| 7,111,149 B2 | 9/2006 | Eilert |
| 7,122,912 B2 | 10/2006 | Matsui |
| 7,157,787 B2 | 1/2007 | Kim et al. |
| 7,193,308 B2 | 3/2007 | Matsui |
| 7,262,495 B2 | 8/2007 | Chen et al. |
| 7,297,574 B2 | 11/2007 | Thomas et al. |
| 7,335,972 B2 | 2/2008 | Chanchani |
| 7,355,273 B2 | 4/2008 | Jackson et al. |
| 7,399,706 B2 | 7/2008 | Omoto et al. |
| 7,843,064 B2 | 11/2010 | Kuo et al. |
| 2005/0095847 A1* | 5/2005 | Kunishima et al. ............ 438/637 |
| 2006/0043535 A1* | 3/2006 | Hiatt ............................. 257/621 |
| 2007/0048969 A1* | 3/2007 | Kwon et al. ................... 438/455 |
| 2008/0111213 A1* | 5/2008 | Akram et al. .................. 257/621 |
| 2009/0250821 A1* | 10/2009 | Borthakur ..................... 257/762 |

\* cited by examiner

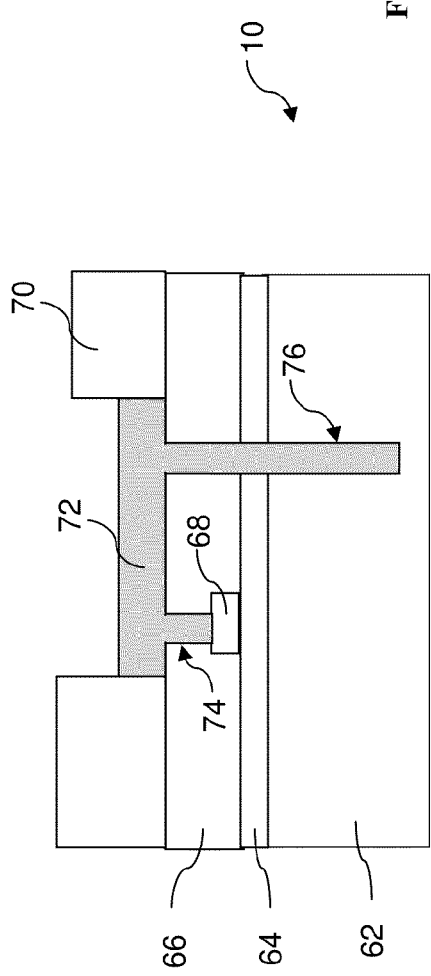
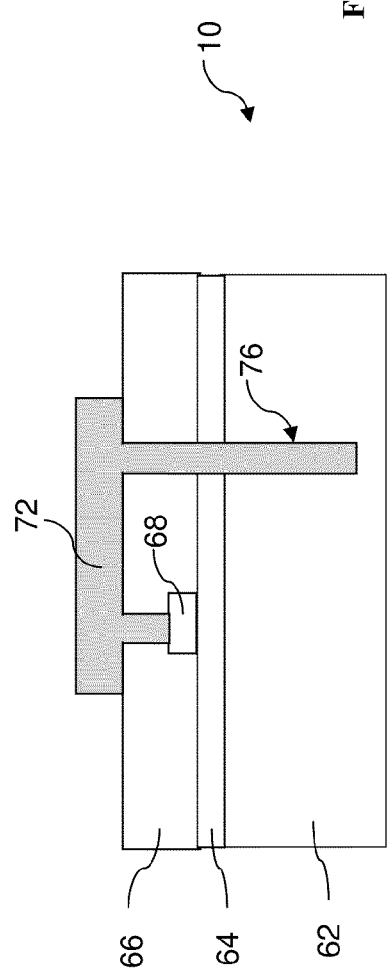

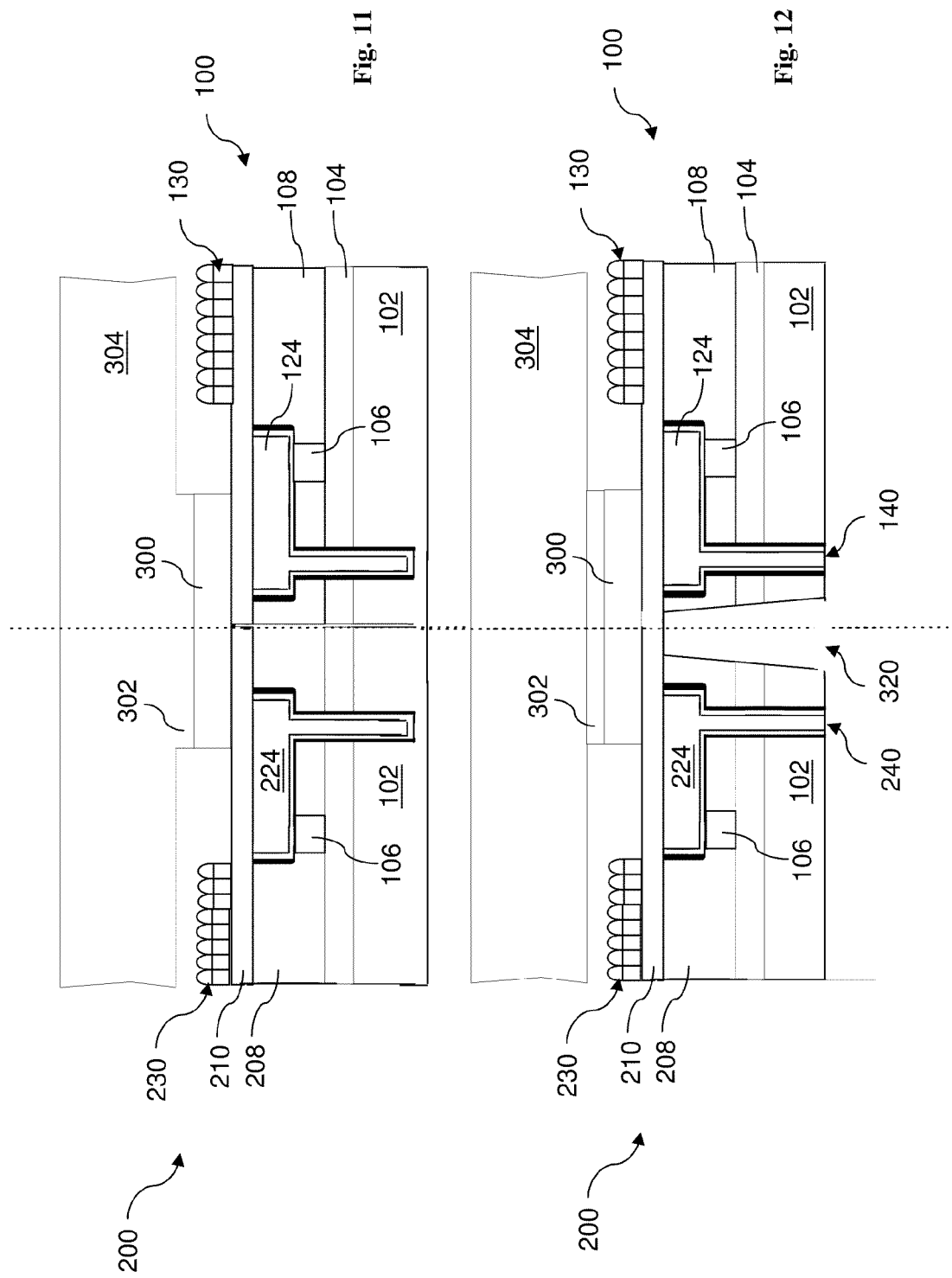

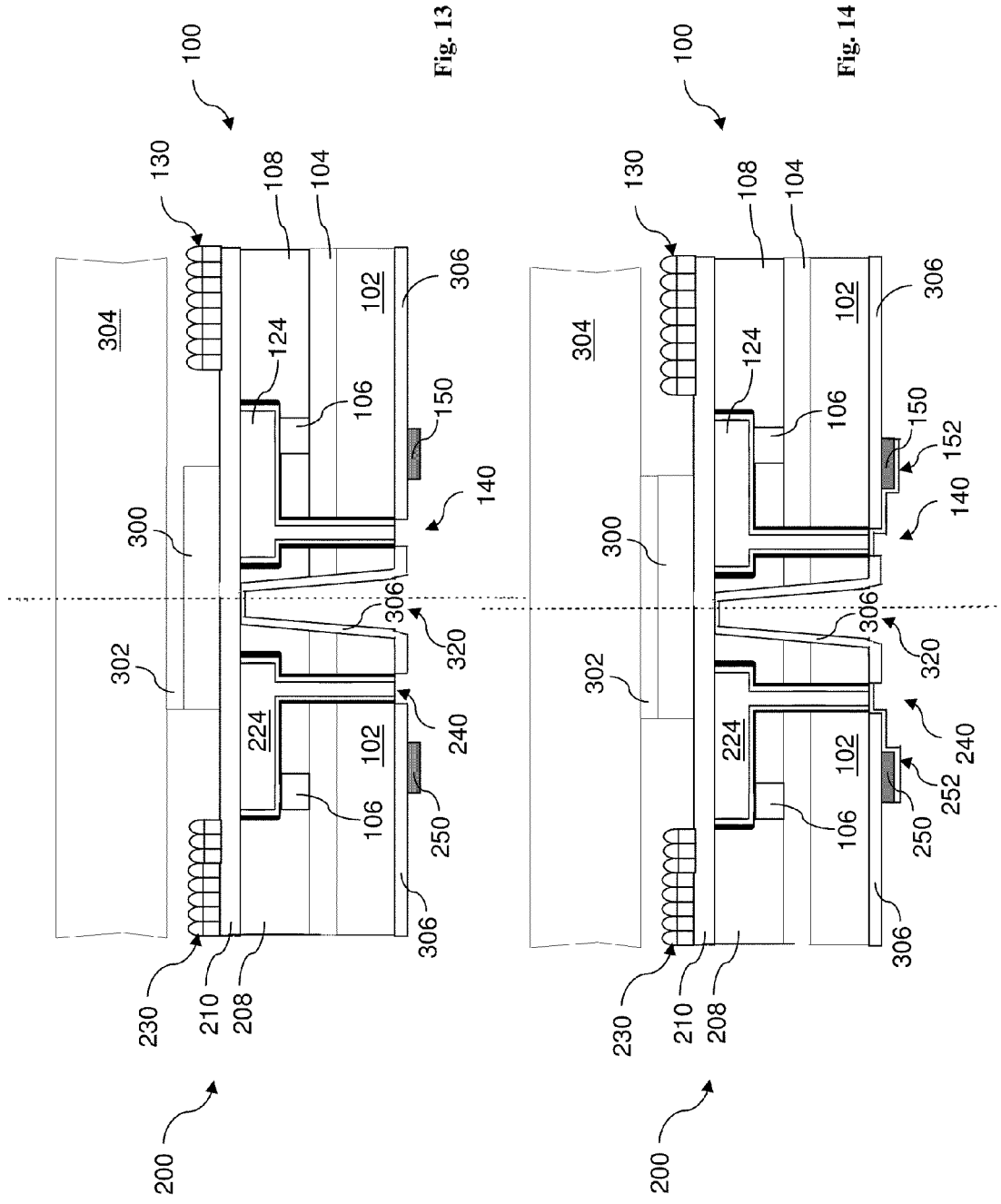

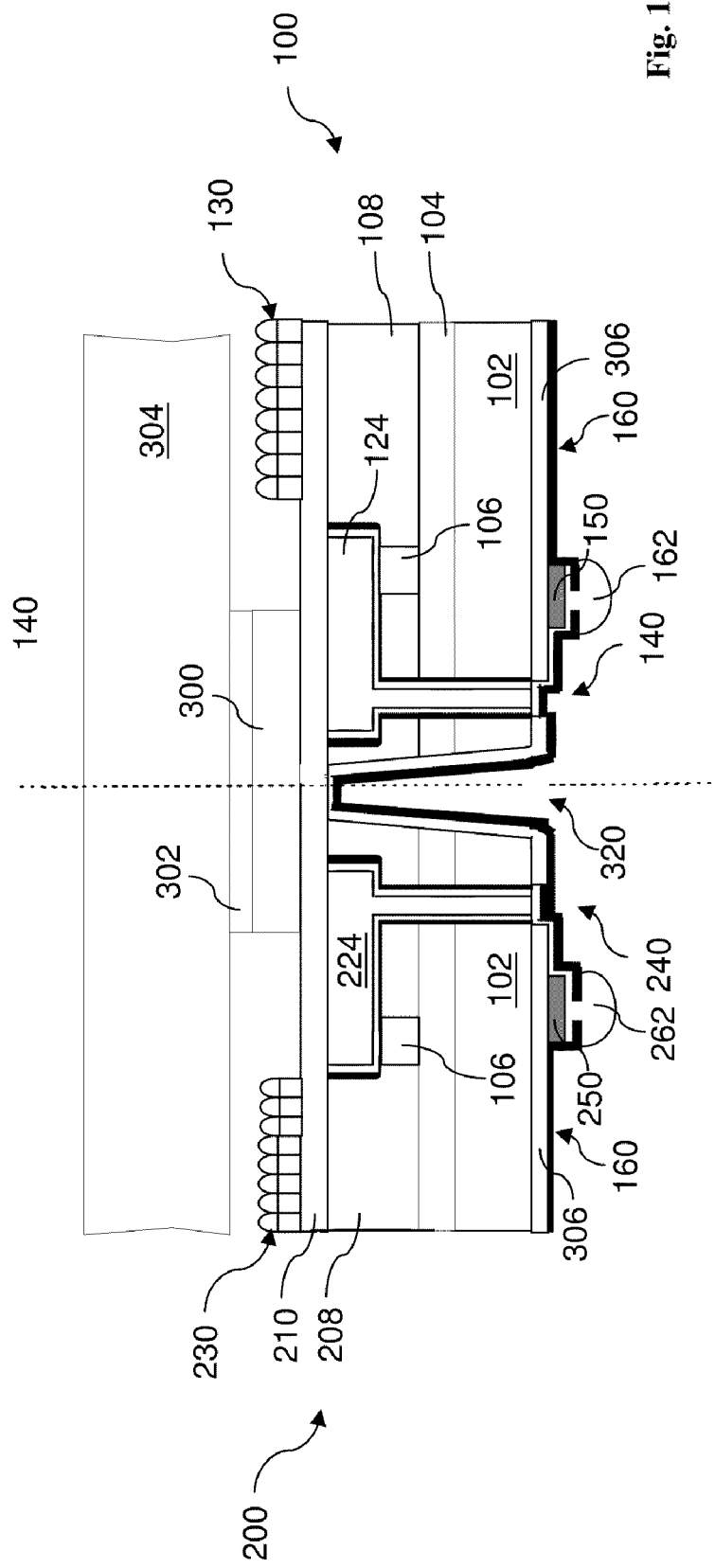

BONDING PROCESS FOR CMOS IMAGE SENSOR

CROSS REFERENCE

This application is a continuation-in-part of U.S. Ser. No. 12/206,349 filed Sep. 8, 2008, herein incorporated by reference in its entirety. The present disclosure is related to the following commonly-assigned U.S. patent applications, the entire disclosures of which are incorporated herein by reference: U.S. Ser. No. 12/152,381 entitled "Structure and Process for the Formation of TSVs," filed May 14, 2008 by inventors Chen-Cheng Kuo et. al; and U.S. Ser. No. 12/206,349 filed Sep. 8, 2008 by inventors Kuo-Ching Hsu, et al. for "INTRODUCING A METAL LAYER BETWEEN SIN AND TIN TO IMPROVE CBD CONTACT RESISTANCE FOR P-TSB".

BACKGROUND

There are several types of semiconductor integrated circuit devices where external connections, e.g., bond pads, are placed on the "back side" of the device, i.e., on the side of the semiconductor substrate opposite to the side with most of the metallization layers.

FIG. 1a provides a side cross-sectional view of two chip scale package (CSP) devices 10, 12 that include CMOS image sensors. FIG. 1a shows the two devices 10, 12 connected to a carrier substrate 14, such as a carrier wafer, via an appropriate connection. The devices 10, 12 further include bond pads 20, 22 and corresponding solder bumps 24, 26, respectively, on the back side of the devices. Metal interconnects 30, 32 connect the bond pads 20, 22 to the front side of the device 10, 12, respectively.

FIG. 1b provides a top view of the two CSP devices 10, 12 and a scribe area 40 there between. Each device 10, 12 actually includes several bond pads, including a row of pads 42, 44 and extension pads 46, 48, respectively. The scribe area 40 includes a scribe line 50 and a pair of seal rings 52, 54.

Several problems exist with the above-described devices. For one, the number of pads must be doubled due to the extension pads, which requires extra space and enlarge chip size. Another problem is that an outer dielectric film is subject to cracking and moisture. The metal interconnects also present reliability problems.

FIGS. 1c and 1d further provide sectional views of the CSP device 10 with more details. Formed on the substrate 62 are interconnection 64 and the passivation layer 66. A metal pad 68 is formed on the interconnection 64. Then a dielectric film 70, such as a dry film, is formed on the passivation layer and is further patterned. A metal structure 72 is formed within the opening of the patterned dielectric film. The metal structure 72 includes a metal post 74 contacting the metal pad 68 and a through silicon via (TSV) metal post 76. Then the patterned dielectric film 70 is removed, leaving the metal structure 72 extruded from the passivation layer 66, as illustrated in FIG. 1d. The top surface of the metal structure 72 and the top surface of the passivation layer 66 have a step height, causing packaging issues and associated device performance concerns.

SUMMARY

The present disclosure provides a method of making an integrated circuit (IC) in certain embodiments. The method includes forming an electric device on a front side of a substrate; forming a top metal pad on the front side of the substrate, the top metal pad being coupled to the electric device; forming a passivation layer on the front side of the substrate, the top metal pad being embedded in the passivation layer; forming an opening in the passivation layer, exposing the top metal pad; forming a deep trench in the substrate; filling a conductive material in the deep trench and the opening, resulting in a through-wafer via (TWV) feature in the deep trench and a pad-TWV feature in the opening, where the top metal pad being connected to the TWV feature through the pad-TWV feature; and applying a polishing process to remove excessive conductive material, forming a substantially planar surface.

The present disclosure also provides a method of forming an integrated circuit in other embodiments. The method includes forming a semiconductor device in a front surface of a silicon substrate; forming a multilayer interconnection (MLI) on the semiconductor device from the front side of the silicon substrate; forming a metal pad on the MLI, the metal pad being coupled with the semiconductor device; forming a dielectric layer on the metal pad and the silicon substrate, the metal pad being embedded in the dielectric layer; etching the dielectric layer to form a trench in the dielectric layer, exposing the metal pad within the trench; performing a dielectric etch to form a via in the MLI; performing a silicon etch to continue the via through the silicon substrate to form a through-silicon via (TSV); performing copper metallization on the TSV and the trench; and thereafter applying a chemical mechanical polishing (CMP) process.

According to various embodiments, the present disclosure also provides an integrated circuit. The integrated circuit includes an electric device formed on a front side of a substrate; a passivation layer formed on the front side of the substrate; a metal pad embedded in the passivation layer and coupled with the electric device; a through-wafer via (TWV) feature formed in the substrate and extended to a backside of the substrate; and a pad-TWV metal feature embedded in the passivation layer and contacting the metal pad and the TWV feature, wherein the pad-TWV and the passivation layer have coplanar top surfaces.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 1a is a side, cross-sectional view and FIG. 1b is a top view, aligned with FIG. 1a, of two prior art sensor devices.

FIGS. 1c and 1d are sectional views of a CSP device.

FIGS. 2-15 are various cross sectional views of an integrated circuit (IC) device during various processing stages, constructed according to one or more embodiments of the present invention.

DETAILED DESCRIPTION

Figures 1A, 1B:
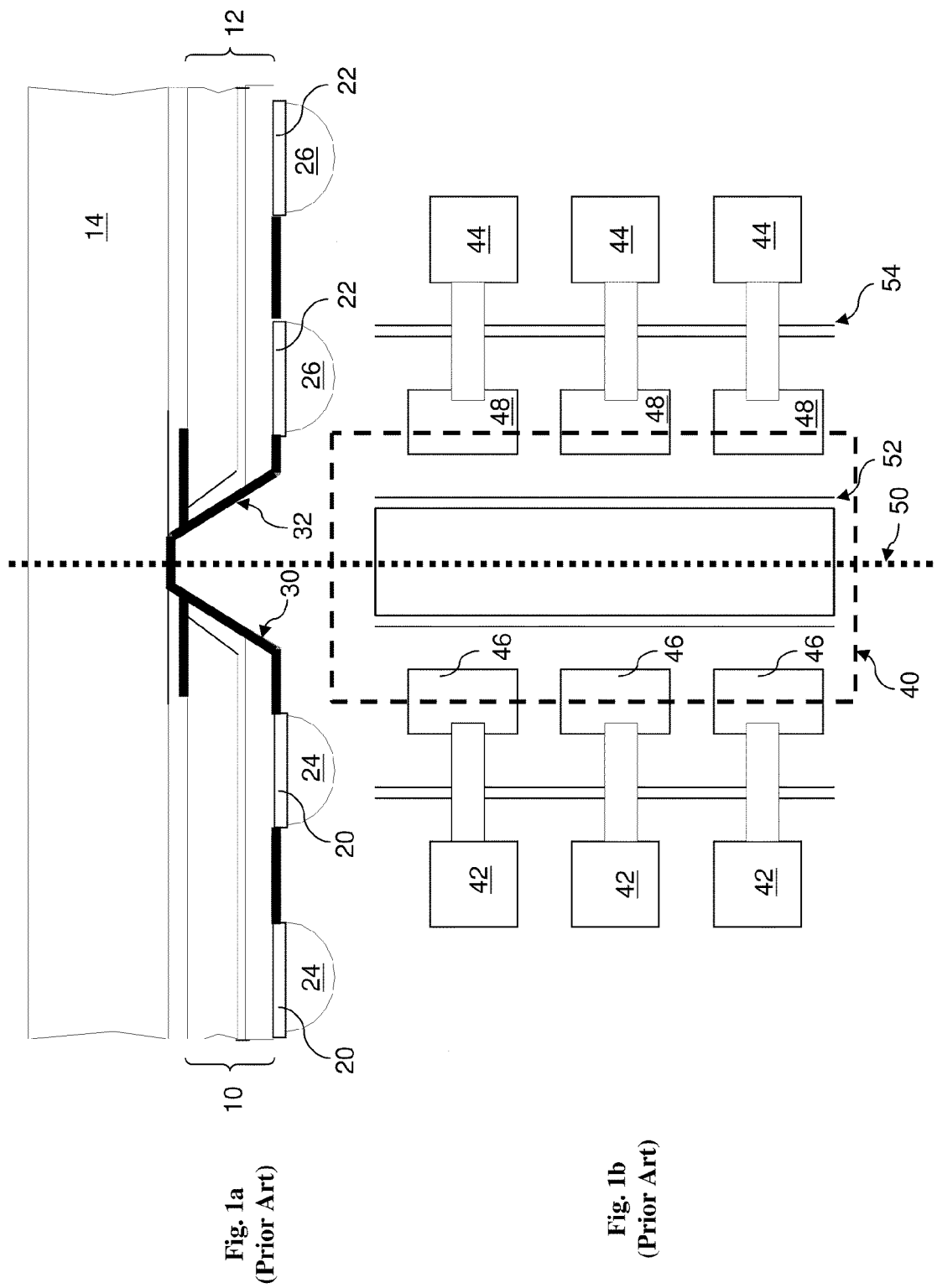
FIG. 1a is a side cross-sectional view of two chip scale package (CSP) devices.
FIG. 1b is a top view of the two CSP devices.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

For the sake of example, an example device will be shown to progress through a series of processing operations to illustrate various embodiments of the present invention. It is understood that several processing steps may be only briefly described, such steps being well known to those of ordinary skill in the art. Also, additional processing steps can be added, and certain of the following processing steps can be removed and/or changed while still implementing the claimed invention. Thus, the following description should be understood to represent examples only, and are not intended to suggest that one or more steps is required.

FIGS. 2 through 15 are sectional views of an integrated circuit device during different fabrication stages and constructed according to aspects of the present disclosure. With reference to FIGS. 2 through 15, an integrated circuit 100 and a method of making the same are collectively described.

Figure 2:
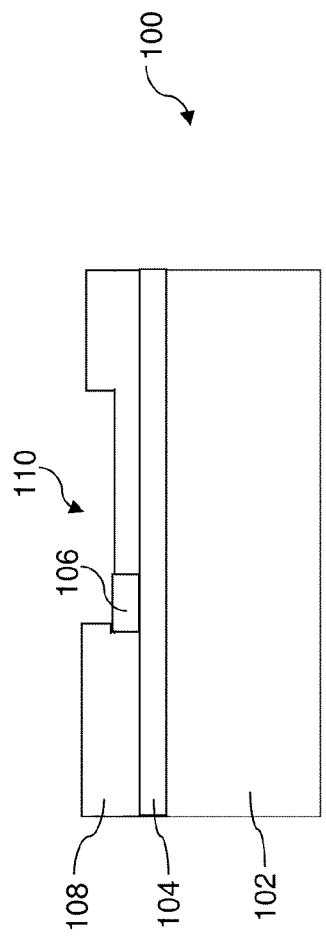

Referring to FIG. 2, a device 100 includes a substrate 102 which, according to the present embodiments, is a silicon substrate. In one example, the silicon substrate is a 8' silicon wafer or a 12' silicon wafer. The substrate 102 may alternatively or additionally include other elementary semiconductor, such as germanium. The substrate 102 may also include a compound semiconductor, such as silicon carbide, gallium arsenic, indium arsenide, and indium phosphide.

In one embodiment, the semiconductor substrate 102 includes an epitaxial layer. For example, the substrate may have an epitaxial layer overlying a bulk semiconductor. In the present embodiment, a P+ epitaxy silicon layer is formed on the silicon substrate and a P− epitaxy silicon layer is formed on the P+ epitaxy silicon layer. Further, the substrate may be strained for performance enhancement. For another example, the epitaxial layer may include semiconductor materials different from those of the bulk semiconductor such as a layer of silicon germanium overlying a bulk silicon, or a layer of silicon overlying a bulk silicon germanium formed by a process including selective epitaxial growth (SEG). Furthermore, the substrate 102 may includes a semiconductor-on-insulator (SOI) structure. In various examples, the substrate includes a buried oxide (BOX) layer formed by a process such as separation by implanted oxygen (SIMOX). The substrate 102 includes various doped wells and other doped features configured and coupled to form various microelectronic devices such as metal-insulator-semiconductor field effect transistor (MOSFET) including complementary MOSFET (CMOS), and CMOS imaging sensor (CIS). Additionally or alternatively, the substrate 102 includes micro-electro-mechanical system (MEMS), and/or other suitable active and/or passive devices. The doped wells and other doped features include p-type doped region and/or an n-type doped region, formed by a doping process such as ion implantation. Other structures such as gate dielectric and polysilicon gate electrodes may be additionally formed on the substrate for devices such as MOSFET device. The substrate 102 also includes various isolation features configured to separate various devices from each other for proper isolation. The isolation features may include different structures and can be formed by a particular processing technologies. In one example, the isolation features include dielectric isolation such as shallow trench isolation (STI). The STI can be fabricated by etching the substrate to form a trench and filling the trench with one or more dielectric material layers.

One or more metal layers (or interconnect) and isolation dielectrics, collectively referred to as metallization 104, are formed above the substrate 102. A top metal pad 104a is formed, illustrated for example, on the metallization 104. A dielectric layer 108 is further formed on the metallization 104 and the top metal pad 106. In the present embodiment, the top metal pad 106 includes copper, aluminum, tungsten or other suitable conductive materials.

The interconnect is configured to properly connect various doped regions in the substrate. In present embodiment, the interconnection includes multilayer interconnect (MLI) having horizontal conductive features (metal lines) disposed at multiple metal layers and vertical conductive features, such as contacts and vias. A via is configured to connect two metal lines at different metal layers. A contact is configured to connect a metal line and the substrate. The multilayer interconnect includes copper. Copper interconnect may include copper, copper alloy, titanium, titanium nitride, tantalum, tantalum nitride, tungsten, polysilicon, metal silicide, or combinations. The copper interconnect may be formed by a technique such as CVD, sputtering, plating, or other suitable processes. The metal silicide used in multilayer interconnects may include nickel silicide, cobalt silicide, tungsten silicide, tantalum silicide, titanium silicide, platinum silicide, erbium silicide, palladium silicide, or combinations thereof. Alternatively, the multilayer interconnect may include aluminum, aluminum/silicon/copper alloy, titanium, titanium nitride, tungsten, polysilicon, metal silicide, or combinations in aluminum interconnect. Aluminum interconnect can be formed by a process including physical vapor deposition (PVD or sputtering), chemical vapor deposition (CVD), or combinations thereof. Other manufacturing techniques to form the aluminum interconnect may include photolithography processing and etching to pattern the conductive materials for vertical (via and contact) and horizontal connects (conductive line). Still other manufacturing processes such as thermal annealing may be used to form metal silicide to reduce contact resistance.

The isolation dielectric is disposed in the interconnect structure to isolate the various conductive features. The isolation dielectric includes an interlayer dielectric (ILD) disposed between the substrate and the first metal layer. The isolation dielectric also includes inter-metal dielectric (IMD) disposed between adjacent metal layers. The isolation dielectric includes a dielectric material such as silicon oxide, silicon nitride, silicon oxynitride, or spin-on glass (SOG). The dielectric material alternatively includes a material of a low dielectric constant (low k) such as a dielectric constant less than about 3.2. In various examples, the dielectric material may include silicon dioxide, silicon nitride, silicon oxynitride, spin-on glass (SOG), fluoride-doped silicate glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other suitable materials. The isolation dielectric is formed by a technique including spin-on coating, CVD, or other suitable processes.

In one embodiment, the dielectric layer 108 includes a passivation layer. In one example, the passivation layer includes silicon oxide. The silicon oxide passivation layer may have a thickness ranging between about 100 nm and about 2000 nm. In another example, the silicon oxide layer is formed by a plasma enhanced CVD (PECVD) process. Alternatively, the passivation layer includes a first passivation film formed on the metallization 104, and a second passivation film formed on the first passivation film. In one example, the first passivation film includes silicon oxide. In another example, the second passivation film includes silicon nitride and/or silicon oxynitride. The second passivation layer may have a thickness ranging between about 2 K angstrom and about 15 K angstrom. In one example, a silicon nitride passivation layer is formed by a plasma enhanced CVD (PECVD) process.

The passivation layer 108 is further patterned to form an opening 110, exposing the top metal pad 106 by an etching procedure. In one example, a photoresist pattern is formed on the passivation layer 108 by a lithography process, then one or more etching steps are implemented to form the opening 110 in the passivation layer. Then the photoresist pattern is removed by a process, such as stripping or ashing.

Figure 3:
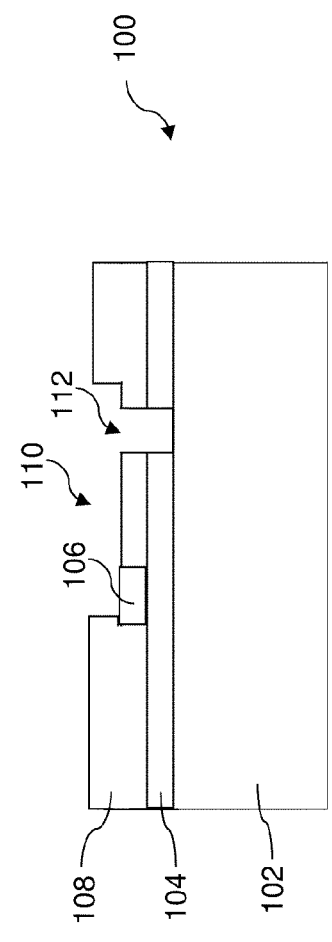

Referring to FIG. 3, a trench 112 is further formed in the passivation layer 108 and the metallization 104 by a process including photolithography patterning and etching. In one embodiment, a photoresist pattern is formed on the passivation layer 108 by a lithography process, defining an opening in the photoresist pattern. Then one or more etching steps are implemented to form the trench 112 in the passivation layer 108 and the metallization 104. Then the photoresist pattern is removed by a process, such as stripping or ashing. In another embodiment, a photoresist pattern is formed on the passivation layer 108 by a lithography process. Then one or more etching steps are implemented to form the trench 112 in the passivation layer. Then the photoresist pattern is removed. The trench 112 is further extended to the metallization by an etching process with suitable etching chemicals. In various embodiments, metal/oxide etch, e.g., dry etch, is performed on the metallization and passivation layers to form a first part of trench 112 down to the substrate 102. For example, a dry etching process with etchant CF4, C3F8, C4F8, CHF3, and/or CH2F2 is implemented to etch silicon oxide.

Figure 4:
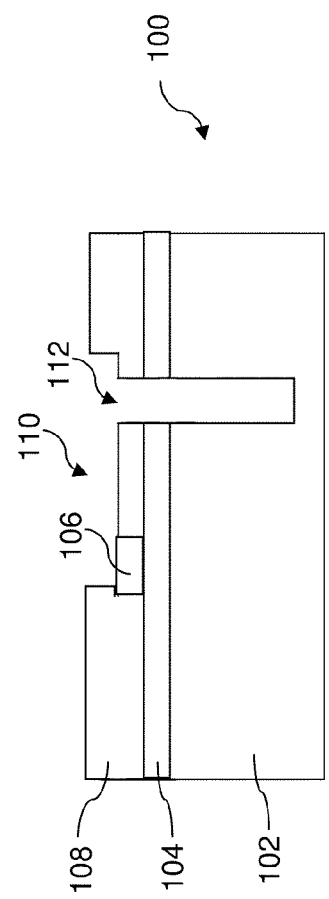

Referring to FIG. 4, a silicon etch is performed to continue the trench 112 into the substrate 102. For one example, a dry etching process with etchant HBr, Cl2, SF6, and/or O2 is implemented to etch silicon substrate to form the trench 112. Thus formed deep trench 112 may also be referred to as through-silicon via (TSV) or generally through-wafer via (TWV) to include other non-silicon substrate.

Figure 5:
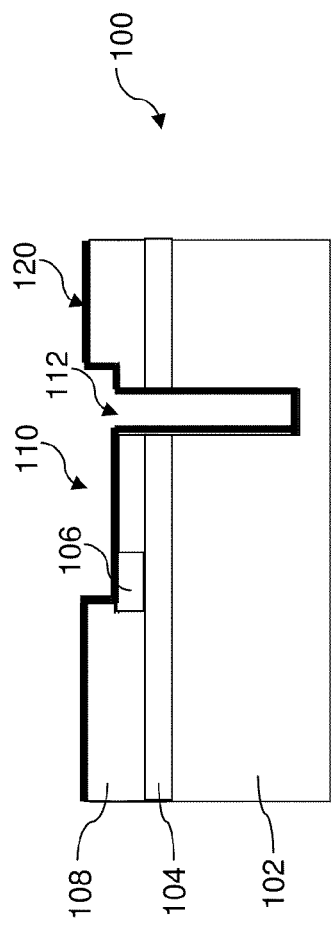

In FIG. 5, an isolation layer 120 is deposited over the device 100, including the trench 110. In one embodiment, the isolation layer 120 is formed to be conformal to the device on the passivation layer 108, in the opening 110, and in the trench 112, particularly on the sidewalls thereof. In one embodiment, the isolation layer 120 includes a diffusion barrier layer. In one embodiment, the isolation layer includes nitride and/or TEOS. In another embodiment, the layer 120 may alternatively use other materials effective for diffusion barrier, such as tantalum nitride or titanium nitride.

Figure 6:
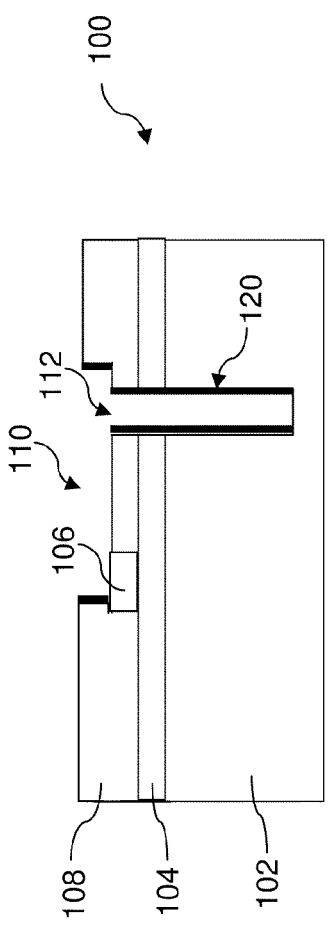

In FIG. 6, portions of the isolation layer 120 are subsequently removed, such that the bottom of the trench 112 and top metal pad 116 are exposed by a suitable etch process. For example, a dry etching process may be implemented to remove the portion of the isolation layer for forming a through-silicon via metal structure with a connection to the top metal pad. It is understood that this can be accomplished through various techniques known in the art.

Figure 7:
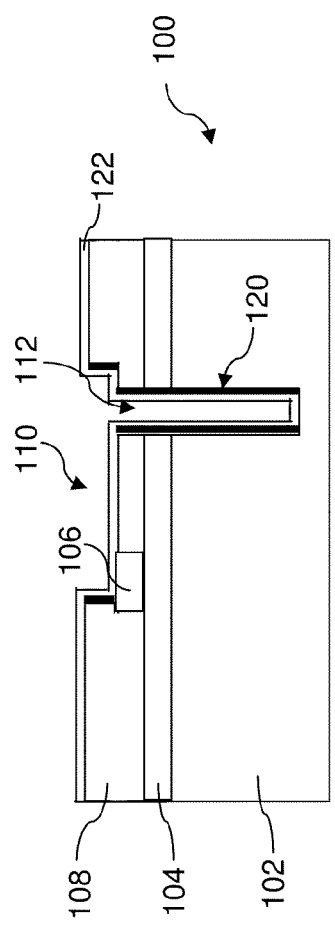

Referring to FIG. 7, a copper seed layer 122 is then deposited over the surface of the device 100. Particularly, the copper seed layer is formed on the top metal pad 106 and the bottom/sidewalls of the trench 112. In the present embodiment, the copper seed layer 122 is between about 1000 Å to about 10,000 Å. In one embodiment, this is performed through physical vapor deposition (PVD or sputtering).

Figure 8:
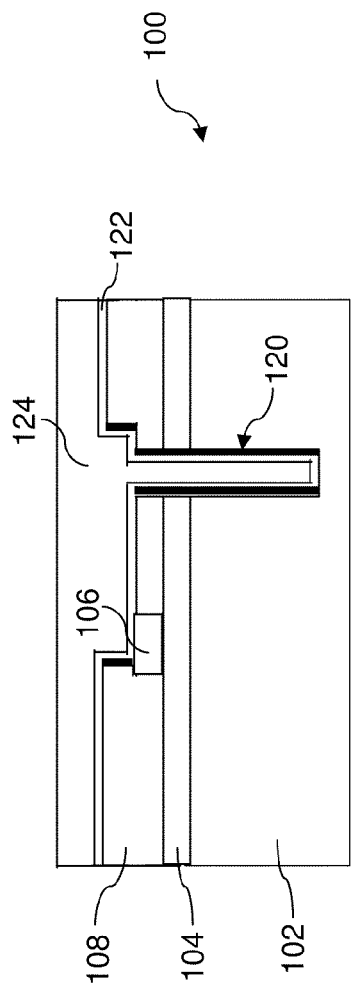

In FIG. 8, a bulk copper 124 is formed on the copper seed layer 122. In one embodiment, the bulk copper layer 124 is formed by a plating process. In the present embodiment, the bulk copper 124 fills the entire upper surface of the device 100, particularly fills in the trench 112 (or TSV), and the opening 110. The bulk copper filled in the trench 112 is referred to as a TSV (or TWV) feature and the bulk copper filled in the opening 110 is referred to as a pad-TWV feature. The pad-TWV feature connects to both the metal pad 106 and the TWV feature. The TWV feature may have a length ranging between about 10 micron and about 600 micron. In another embodiment, the TWV feature has a dimension, in a top view, ranging between about 5 micron and about 100 micron.

Figure 9:
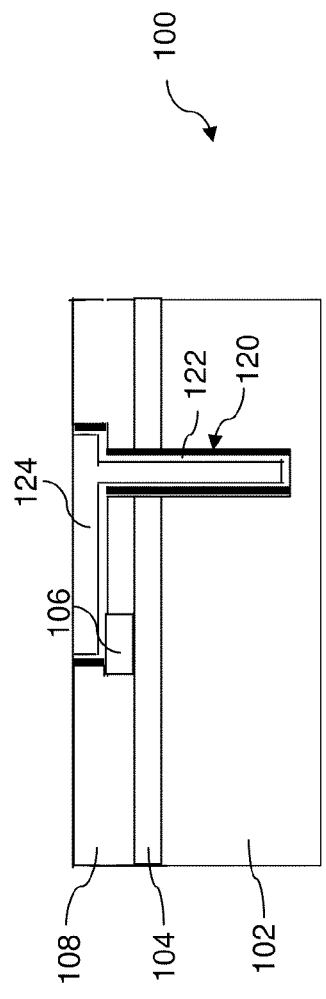

In FIG. 9, a polishing process is applied to device 100 to remove the excessive copper, including the bulk copper and copper layer above the top surface of the passivation layer. In the present embodiment, the polishing process is a chemical-mechanical polish (CMP). Thereby, the top surface of the pad-TWV feature is substantially coplanar with the top surface of the dielectric layer 108. The step height between the pad-TWV feature and the dielectric layer 108 is eliminated or substantially reduced. For example, the step height between the pad-TWV feature and the dielectric layer 108 is less than about 5 micron.

Figure 10:
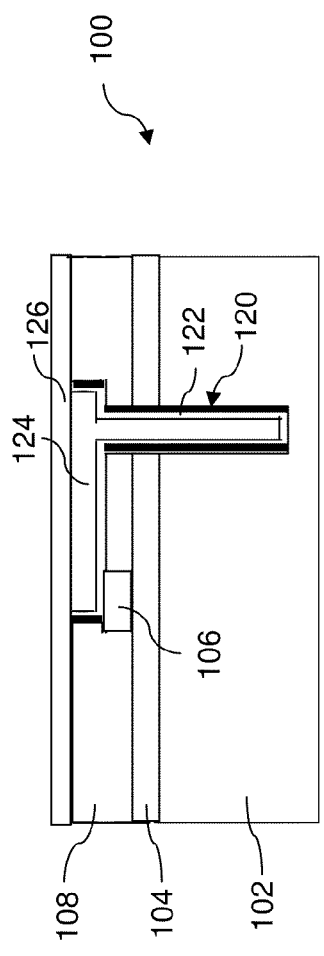

In FIG. 10, a protection layer 126 is deposited on the top surface of the device, above the copper layer 124 and above the passivation layer 108. It is noted that in the present embodiment, there is no step height issue in the protection layer 126 since the pad-TWV feature and the dielectric layer 108 are coplanar. The protection layer is transparent to the imaging light such that the light from an object is able to illuminate through the transparent protection layer to reach the image sensor. In one embodiment, the protection layer is silicon nitride (SiN) and can be formed by a CVD process, such as PECVD. In furtherance of the embodiment, the CVD process to form the SiN layer includes precursors Hexachlorodisilane (Si2Cl6), Dichlorosilane (SiH2Cl2), Bis(Tertiary-ButylAmino)Silane (C8H22N2Si) and Disilane (Si2H6). In one embodiment, the protection layer 126 serves as a passivation layer. The protection layer 126 have a thickness ranging between about 100 nm and about 20000 nm.

By the method described above, the TSV feature is formed and connected to the top metal pad 106 through the pad-TWV feature in the passivation layer 108. The step height issue is eliminated or reduced, and the overall thickness is reduced.

Referring now to FIG. 11, two exemplary devices are shown on the same substrate 102. In the present embodiment, the two devices are the similar, and one device 100 uses the reference numerals used in FIGS. 2-10. The other device uses similar reference numerals, albeit with a 200 designation, where the devices and/or layers are different. It is understood that each exemplary device can include a plurality of CMOS image sensors and other suitable electrical elements. Further, each device, as a die, is to be separated from other devices from the wafer by dicing.

Continuing with the present embodiment, the devices 100, 200 include a plurality of micro lenses and color filters 130, 230. In one example, the color filters include organic material formed by spin-on coating. In another example, the color filters include red, green, and blue filters. A dam or separator structure 300 is positioned near the edge of both devices 100, 200, and an epoxy layer 302 secures the dam (and thus the devices) to a carrier substrate (glass or wafer) 304. The dam structure 300 is interposed between adjacent image sensors for separation. The dam structure 300 includes a dielectric material. In various embodiments, the dielectric material includes silicon nitride, silicon oxynitride, silicon oxide, resin, polymer, combinations thereof, and/or other suitable materials. The dam structure may be formed by depositing a dielectric material layer and then patterning it using a lithography patterning process. The dielectric layer may be formed by CVD, PVD, ALD, spin-on coating, and/or other proper methods. The dielectric layer may have a multilayer structure including a planarization layer, and/or a spacer layer in one example. The dielectric layer may be formed by a method described above and may be substantially planar, possibly the result of chemical-mechanical-polishing (CMP). In one embodiment, the dam structure 300 has a thickness ranging between about 0.2 μm and 50 μm. The lenses and color filters may be positioned such that the incident light is directed thereon and therethrough. In one embodiment, such color-transparent layers may include a polymeric material (e.g., negative photoresist based on an acrylic polymer) or resin.

In FIG. 12, a backside of the substrate 102 is then ground down so that the copper layers 124, 224 in the trenches 112 form through-silicon vias (TSVs, or through-wafer vias) 140, 240. Also, a scribe trench 320 is formed to separate the two devices 100, 200 during assembly. The scribe trench 320 is formed by an etching process applied from the backside of the substrate 102. A lithography process may be applied to the backside of the substrate to define a scribe line region and then the etching process is implemented to etch the scribe line region to form the scribe trench.

In FIG. 13, an isolation material layer 306 is deposited on the backside of the devices 100, 200, and is further patterned to expose the TSVs 140, 240. The isolation material layer is also formed in the sidewalls of the scribe trench. Then, underlying CSM (coating solder mask) pads 150, 250 are attached to the backside of the substrate 102.

In FIG. 14, conductor leads 152 and 252 are provided from the pads 150, 152 to the respective TSV 140, 240.

In FIG. 15, a solder mask layer 160 and corresponding solder balls (or bumps) 162, 262 are formed on the backside of the devices 100, 200, thereby providing electrical connection through the TSVs 140, 150 to the devices. Then a dicing process is applied to separate the devices 100 and 200 in the scribe line.

The present embodiment provides several benefits. By using a damascene process to form a conductive feature connecting the TSV and the top metal pad, the wafer thickness is reduced and the step height is eliminated. The damascene process includes etching the passivation layer to form an opening; filling in the opening with copper, and applying CMP process to remove the excessive copper, resulting a flat surface. The overall device size is reduced due to various factors, such as fewer bond pads and the elimination of a double seal ring. Also, the reliability of the chip scale package (CSP) is improved (e.g., reduced dielectric film cracking), and good planarization is provided.

The present disclosure provides a CMOS image sensor device and the method making the same. Although various embodiments are provided, other variations in this spirit and scope are considered as consistent with the present disclosure and are suggestive. For example, the imaging device could alternatively or collectively includes photodiode or pinned photodiode. In furtherance of example, each pixel of the imaging device includes a photodiode and a MOS transistor; a pinned photodiode and 4 transistors; or a non-pinned photodiode and 4 transistors. In another example, a dicing process is performed to the scribe trench to separate various devices into standalone dies for further packing.

Thus, the present disclosure provides a method of making an integrated circuit (IC). The method includes forming an electric device on a front side of a substrate; forming a top metal pad on the front side of the substrate, the top metal pad being coupled to the electric device; forming a passivation layer on the front side of the substrate, the top metal pad being embedded in the passivation layer; forming an opening in the passivation layer, exposing the top metal pad; forming a deep trench in the substrate; filling a conductive material in the deep trench and the opening, resulting in a through-wafer via (TWV) feature in the deep trench and a pad-TWV feature in the opening, where the top metal pad being connected to the TWV feature through the pad-TWV feature; and applying a polishing process, such as chemical mechanical polishing, to remove excessive conductive material, forming a substantially planar surface.

In one embodiment, the present method may include forming a dielectric layer on the front side of the substrate after the applying of the polishing process; grinding the substrate from a backside to expose the TWV feature; and etching the substrate in a scribe region from the backside to form a scribe-line trench. The method may further include forming a dielectric material layer on surfaces of the scribe-line trench; and forming a coating solder mask (CSM) on the dielectric material layer. The method may further include forming an external lead on the backside of the substrate and on the CSM, the external lead being connected to the TWV feature; and forming a solder bump on the CSM with the external lead interposed between the CSM and the solder bump. The filling of the conductive material may include forming an isolation layer in the opening and the deep trench; performing a dry etch to the isolation layer to remove isolation layer on a first bottom surface of the opening and a second bottom surface of the deep trench; forming a copper seed layer on the isolation layer, the first bottom surface and the second bottom surface, using physical vapor deposition (PVD); and forming bulk copper on the copper seed layer by plating. The forming of the electric device may include forming a complementary metal-oxide-semiconductor (CMOS) image sensing element on the front side of the substrate. The method may further include forming a plurality of color filters and a plurality of lens on the front side of the substrate. The method may further include forming an epoxy feature on the front side of the substrate within scribe region. The method may further include attaching the substrate from the front side to a carrier wafer. The method may further include dicing the integrated circuit within the scribe-line trench.

The present disclosure also provides a method of forming an integrated circuit in another embodiment. The method includes forming a semiconductor device in a front surface of a silicon substrate; forming a multilayer interconnection (MLI) on the semiconductor device from the front side of the silicon substrate; forming a metal pad on the MLI, the metal pad being coupled with the semiconductor device; forming a dielectric layer on the metal pad and the silicon substrate, the metal pad being embedded in the dielectric layer; etching the dielectric layer to form a trench in the dielectric layer, exposing the metal pad within the trench; performing a dielectric etch to form a via in the MLI; performing a silicon etch to continue the via through the silicon substrate to form a through-silicon via (TSV); performing copper metallization on the TSV and the trench; and thereafter applying a chemical mechanical polishing (CMP) process.

In the present method, the performing of the copper metallization may include forming a copper seed layer by sputtering; and forming bulk copper on the copper seed layer by plating. The performing of the copper metallization may further include, prior to the forming of the copper seed layer and the forming of the bulk copper: forming an isolation layer in the trench and the TSV; and performing a dry etch to the isolation layer to remove isolation layer on a first bottom surface of the trench and a second bottom surface of the TSV. The method may further include forming a passivation layer after the CMP process; forming color filters on the passivation layer; grinding the silicon substrate from a backside; and providing a bonding mechanism on a backside of the integrated circuit, the bonding mechanism being connected to the TSV. The providing of the bonding mechanism may include forming a coating solder mask (CSM) on the backside of the substrate; forming a conductive feature extending from the CSM to the TSV; and forming a solder ball on the conductive feature interposed between the solder ball and the CSM. The method may further include attaching the silicon substrate from the front surface to a carrier substrate.

The present disclosure also provides an integrated circuit. The integrated circuit includes an electric device formed on a front side of a substrate; a passivation layer formed on the front side of the substrate; a metal pad embedded in the passivation layer and coupled with the electric device; a through-wafer via (TWV) feature formed in the substrate and extended to a backside of the substrate; and a pad-TWV metal feature embedded in the passivation layer and contacting the metal pad and the TWV feature, wherein the pad-TWV and the passivation layer have coplanar top surfaces.

In one embodiment, the integrated circuit further includes a solder ball on the backside of the substrate in electrical connection with the TWV feature and a carrier substrate attached to the substrate from the front side. In other embodiments, the electric device includes an imaging element selected from the group consisting of complementary metal-oxide-semiconductor (CMOS) image sensor, photodiode, and pinned photodiode; and the integrated circuit further includes micro lens and color filters positioned on the front side of the substrate and aligned with the imaging element. In another embodiment, the TWV feature includes copper and is formed by a damascene process.

Although embodiments of the present disclosure have been described in detail, those skilled in the art should understand that they may make various changes, substitutions and alterations herein without departing from the spirit and scope of the present disclosure. Accordingly, all such changes, substitutions and alterations are intended to be included within the scope of the present disclosure as defined in the following claims. In the claims, means-plus-function clauses are intended to cover the structures described herein as performing the recited function and not only structural equivalents, but also equivalent structures.

What is claimed is:

1. A method of making an integrated circuit (IC), comprising:
    forming an electric device on a front side of a substrate;
    forming a top metal pad on the front side of the substrate, the top metal pad being coupled to the electric device;
    forming a passivation layer on the front side of the substrate, the top metal pad being embedded in the passivation layer;
    forming an opening in the passivation layer, exposing the top metal pad;
    forming a deep trench in the substrate through the opening without the deep trench extending through the top metal pad;
    filling a conductive material in the deep trench and the opening, resulting in a through-wafer via (TWV) feature in the deep trench and a pad-TWV feature in the opening, where the top metal pad being connected to the TWV feature through the pad-TWV feature;
    removing excessive conductive material, forming a substantially planar surface;
    forming a dielectric layer on the front side of the substrate after removing the excessive conductive material;
    grinding the substrate from a backside to expose the TWV feature; and
    etching the substrate in a scribe region from the backside to form a scribe-line trench.

2. The method of claim 1, further comprising:
    forming a dielectric material layer on surfaces of the scribe-line trench; and
    forming a coating solder mask (CSM) on the dielectric material layer.

3. The method of claim 2, further comprising:
    forming an external lead on the backside of the substrate and on the CSM, the external lead being connected to the TWV feature; and
    forming a solder bump on the CSM.

4. The method of claim 1, wherein the filling of the conductive material comprises:
    forming an isolation layer in the opening and the deep trench;
    performing a dry etch to the isolation layer to remove isolation layer on a first bottom surface of the opening and a second bottom surface of the deep trench;
    forming a copper seed layer on the isolation layer, the first bottom surface and the second bottom surface, using physical vapor deposition (PVD); and
    forming bulk copper on the copper seed layer by plating.

5. The method of claim 1, wherein the forming of the electric device comprises forming a complementary metal-oxide-semiconductor (CMOS) image sensing element on the front side of the substrate.

6. The method of claim 5, further comprising forming a plurality of color filters and a plurality of lens on the front side of the substrate.

7. The method of claim 1, further comprising forming an epoxy feature on the front side of the substrate within the scribe region.

8. The method of claim 1, further comprising attaching the substrate from the front side to a carrier wafer.

9. The method of claim 1, further comprising dicing the integrated circuit within the scribe-line trench.

10. A method of forming an integrated circuit, comprising:
    forming a semiconductor device in a front surface of a silicon substrate;
    forming a multilayer interconnection (MLI) on the semiconductor device from the front side of the silicon substrate;
    forming a metal pad on the MIA, the metal pad being coupled with the semiconductor device;
    forming a dielectric layer on the metal pad and the silicon substrate, the metal pad being embedded in the dielectric layer;
    etching the dielectric layer to form a trench in the dielectric layer, exposing the metal pad and a portion of the dielectric layer adjacent to the metal pad within the trench;
    performing a dielectric etch on the portion of the dielectric layer adjacent to the metal pad within the trench to form a via in the MLI;
    performing a silicon etch to continue the via through the silicon substrate to form a through-silicon via (TSV);
    performing copper metallization on the TSV and the trench; and
    thereafter applying a chemical mechanical polishing (CMP) process.

11. The method of claim 10, wherein the performing of the copper metallization comprises:
   forming a copper seed layer by sputtering; and
   forming bulk copper on the copper seed layer by plating.

12. The method of claim 11, wherein the performing of the copper metallization further comprises, prior to the forming of the copper seed layer and the forming of the bulk copper:
   forming an isolation layer in the trench and the TSV; and
   performing a dry etch to the isolation layer to remove isolation layer on a first bottom surface of the trench and a second bottom surface of the TSV.

13. The method of claim 10, further comprising:
   forming a passivation layer after the CMP process;
   forming color filters on the passivation layer;
   grinding the silicon substrate from a backside; and
   providing a bonding mechanism on a backside of the integrated circuit, the bonding mechanism being connected to the TSV.

14. The method of claim 13, wherein the providing of the bonding mechanism comprises:
   forming a coating solder mask (CSM) on the backside of the substrate;
   forming a conductive feature extending from the CSM to the TSV; and
   forming a solder ball on the conductive feature interposed between the solder ball and the CSM.

15. The method of claim 10, further comprising attaching the silicon substrate from the front surface to a carrier substrate.

16. An integrated circuit, comprising:
   an electric device formed on a front side of a substrate;
   a passivation layer formed on the front side of the substrate;
   a metal pad embedded in the passivation layer and coupled with the electric device;
   a through-wafer via (TWV) feature disposed in the substrate and extended to a backside of the substrate without passing through the metal pad, wherein the TWV feature is exposed on the backside of the substrate;
   a pad-TWV metal feature embedded in the passivation layer and contacting the metal pad and the TWV feature, wherein an excess portion of the pad-TWV is removed such that the pad-TWV and the passivation layer have coplanar top surfaces;
   a dielectric layer formed on the front side of the substrate after removal of the excess portion of the pad-TWV metal feature; and
   a scribe-line trench etched in a scribe region of the backside of the substrate.

17. The integrated circuit of claim 16, further comprising a solder ball on the backside of the substrate in electrical connection with the TWV feature and a carrier substrate attached to the substrate from the front side.

18. The integrated circuit of claim 16, wherein the electric device comprises an imaging element selected from the group consisting of complementary metal-oxide-semiconductor (CMOS) image sensor, photodiode, and pinned photodiode; and the integrated circuit further includes micro lens and color filters positioned on the front side of the substrate and aligned with the imaging element.

19. The integrated circuit of claim 16, wherein the TWV feature includes copper and is formed by a damascene process such that the TWV feature is formed proximate to the metal pad without the metal pad surrounding the TWV feature.

* * * * *